(12) United States Patent
Johnson et al.

(10) Patent No.: US 9,614,692 B2
(45) Date of Patent: Apr. 4, 2017

(54) METHOD AND APPARATUS FOR MINIMIZING WITHIN-DIE VARIATIONS IN PERFORMANCE PARAMETERS OF A PROCESSOR

(71) Applicant: Intel Corporation, Santa Clara, CA (US)

(72) Inventors: Luke A. Johnson, Queen Creek, AZ (US); Adhiveeraraghavan Srikanth, Folsom, CA (US); Wenjun Yun, Warwick, RI (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/064,146

(22) Filed: Mar. 8, 2016

(65) Prior Publication Data

US 2016/0191274 A1    Jun. 30, 2016

Related U.S. Application Data

(63) Continuation of application No. 14/674,200, filed on Mar. 31, 2015, now Pat. No. 9,280,162, which is a
(Continued)

(51) Int. Cl.
*H03F 3/45*    (2006.01)
*H04L 25/02*    (2006.01)
(Continued)

(52) U.S. Cl.
CPC ........... *H04L 25/0274* (2013.01); *G05F 1/10* (2013.01); *G06F 13/122* (2013.01);
(Continued)

(58) Field of Classification Search
CPC .... G06F 13/10; G06F 3/067; H03F 2200/555; H03F 2203/45244; G03F 2203/45244
See application file for complete search history.

(56) References Cited

U.S. PATENT DOCUMENTS 6,927,608 B1    8/2005  Chen et al.
7,274,239 B2    9/2007  Lin
(Continued)

FOREIGN PATENT DOCUMENTS

KR    1020060080290    7/2006
KR    1020070045276    5/2007
WO    2006012464       2/2006

OTHER PUBLICATIONS

Notice of Preliminary Rejection for Korean Patent Application No. 10 2011 28270, mailed Aug. 23, 2012.
(Continued)

*Primary Examiner* — Zachary K Huson
(74) *Attorney, Agent, or Firm* — Green, Howard & Mughal LLP

(57) ABSTRACT

Described herein are a method and an apparatus for minimizing within-die variations in performance parameters of a processor. The apparatus comprising: a reference generator to generate an adjustable compensated reference signal; a bias generator to generate a bias signal based on the adjustable compensated reference signal; a transmitter coupled with the bias generator to transmit an output signal; and a feedback mechanism to sample the output signal from the transmitter and to provide the sampled output signal to the bias generator.

20 Claims, 6 Drawing Sheets

Related U.S. Application Data continuation of application No. 14/225,375, filed on Mar. 25, 2014, now Pat. No. 9,009,366, which is a continuation of application No. 12/748,922, filed on Mar. 29, 2010, now Pat. No. 8,683,098.

(51) Int. Cl.

| | | |
|---|---|---|
| G06F 13/12 | (2006.01) | |
| G05F 1/10 | (2006.01) | |
| G06F 13/42 | (2006.01) | |
| G06F 13/10 | (2006.01) | |
| G06F 3/06 | (2006.01) | |
| G06F 13/14 | (2006.01) | |

(52) U.S. Cl.
CPC ...... *G06F 13/4286* (2013.01); *H04L 25/0282* (2013.01); *G06F 3/067* (2013.01); *G06F 13/10* (2013.01); *G06F 13/14* (2013.01); *H03F 2200/555* (2013.01); *H03F 2203/45244* (2013.01); *Y02B 60/1228* (2013.01); *Y02B 60/1235* (2013.01)

(56) References Cited

U.S. PATENT DOCUMENTS

| | | | | |
|---|---|---|---|---|
| 8,683,098 | B2* | 3/2014 | Johnson | H04L 25/0274 710/15 |
| 9,009,366 | B2* | 4/2015 | Johnson | H04L 25/0274 710/15 |
| 2006/0146956 | A1* | 7/2006 | Kim | H03B 5/24 375/297 |
| 2006/0273836 | A1* | 12/2006 | Lin | H03H 11/265 327/158 |
| 2007/0194850 | A1* | 8/2007 | Lin | H03F 1/086 330/260 |
| 2008/0169839 | A1* | 7/2008 | Abadeer | H03K 19/0963 326/82 |
| 2009/0245416 | A1 | 10/2009 | Wu et al. | |

OTHER PUBLICATIONS

Notice of Las Preliminary Rejection for Korean Patent Application No. 10 2011 28270, mailed Feb. 22, 2013.

Office Action for Taiwan Patent Application No. 100106884, mailed Jul. 28, 2014.

Boni, "1.2-Gb/s true PECL 100K compatible I/O interface in 0.35-um CMOS", IEEE Journal of Solid-State Circuits, vol. 38, No. 6, Jun. 2001, pp. 979-987.

Ciubotaru et al., "An integrated dirct-coupled 10-Gb/s driver for common-cathode VCSELs", IEEE Journal of Solid-State Circuites, vol. 39, Iss. 3, Mar. 2004, abstract only.

Maxim, "Notice of Violation of IEEE Publication Principles A 125 Gb/s electro-absorption-modular driver using a cascode switch with dynamic biasing and adaptive RC compensation", Proceedings of the Bipolar/BiCMOs Circuits and Technology Meeting, Oct. 9-11, 2005, abstract only.

Zarkeshvari et al., "High-Speed Serial I/O Trends, Standards, and Techniques", 1st International Conference on Electrical and Electronics Engineering, 2004, pp. 261-266.

Non-Final Office Action for U.S. Appl. No. 12/748,922, mailed Oct. 28, 2011.

Final Office Action for U.S. Appl. No. 12/748,922, mailed Aug. 29, 2012.

Non-Final Office Action for U.S. Appl. No. 12/748,922, mailed Apr. 11, 2013.

Notice of Allowance for U.S. Appl. No. 12/748,922, mailed Nov. 4, 2013.

Non-Final Office Action for U.S. Appl. No. 14/225,375, mailed Aug. 15, 2014.

Final Office Action for U.S. Appl. No. 14/225,375, mailed Oct. 7, 2014.

Notice of Allowance for U.S. Appl. No. 141225,375, mailed Dec. 17, 2014.

Notice of Grant for Taiwan Patent Application No. 100106884, mailed Dec. 18, 2014.

Non-Final Office Action for U.S. Appl. No. 14/674,200, mailed on Jun. 19, 2015.

Notice of Allowance for U.S. Appl. No. 141674,200, mailed on Nov. 9, 2015.

* cited by examiner

METHOD AND APPARATUS FOR MINIMIZING WITHIN-DIE VARIATIONS IN PERFORMANCE PARAMETERS OF A PROCESSOR

CLAIM FOR PRIORITY

This application is a continuation of U.S. patent application Ser. No. 14/674,200, filed on Mar. 31, 2015, entitled "METHOD AND APPARATUS FOR MINIMIZING WITHIN-DIE VARIATIONS IN PERFORMANCE PARAMETERS OF A PROCESSOR", which is a continuation of U.S. patent application Ser. No. 14/225,375, issued 14 Apr. 2015 as U.S. Pat. No. 9,009,366, entitled "METHOD AND APPARATUS FOR MINIMIZING WITHIN-DIE VARIATIONS IN PERFORMANCE PARAMETERS OF A PROCESSOR" which is a continuation of U.S. patent application Ser. No. 12/748,922 issued 25 Mar. 2014 as U.S. Pat. No. 8,683,098, entitled "METHOD AND APPARATUS FOR MINIMIZING WITHIN-DIE VARIATIONS IN PERFORMANCE PARAMETERS OF A PROCESSOR", and which are incorporated by reference in their entirety.

FIELD OF THE INVENTION

Embodiments of the invention relate generally to the field of processors. More particularly, embodiments of the invention relate to a method and an apparatus for minimizing within-die variations in performance parameters of a processor.

BACKGROUND

Devices in a semiconductor die exhibit variations in behavior within the die. These variations include channel length variations and threshold voltage variations in transistors. Such variations are called within-die variations. As a result of such variations, two devices of identical dimensions on the same die may exhibit different behavior (e.g., current drive strength, turn-on and turn-off characteristics, output signal swing, jitter tolerance, etc.) depending on the location of the devices on the die.

For example, one end of a die (also called a processor or a chip) may have devices that behave faster than identical devices of identical dimensions on the other end of the same die. Such variation in the device behavior may be classified as systematic variation and random variation. The systematic variation is generally predictable or repeatable and may be reduced by well known methods such as matching and nesting layout techniques of the devices. However, random variation by definition is unpredictable and may not be reduced by matching and nesting layout techniques alone.

Such variations within a die cause large variations in performance parameters of the die, for example, output signal swings of an input-output (I/O) transmitter in an I/O lane of an I/O system. I/O transmitters are generally situated on the edges of a die. The edges may be long edges e.g., 5000 µm from one end of the edge to the other end of the edge. As mentioned above, one end of an edge of the die may have devices that behave faster or slower than the identical devices on the other end of the edge of the same die. As a result of such wide variations in behavior along the same edge of the die, an I/O transmitter of an I/O lane on one end of an edge of the die may generate output signal swings that are higher or lower than an identical I/O transmitter of another I/O lane on the other end of the same edge. Consequently, receivers for the signals transmitted by such I/O transmitters receive signals of varying swings which may impact the timing budget of the I/O system.

FIG. 1A illustrates an I/O system 100 having a processor 110 communicatively coupled with a receiver 106 via an interconnect 105. The processor 110 includes a traditional centralized current reference generator (ICOMP) 101 to provide compensated bias current to each set of I/O transmitters (e.g., 107) from a plurality of sets of I/O transmitters 107-109. The ICOMP 101 is used to compensate variations in output signal swings generated by each I/O transmitter by controlling the current used by each I/O transmitter (e.g., 104) via its bias generator 103 to generate the output signal swing on the interconnect 105. The bias current generated by the centralized ICOMP is distributed in the die 110 via current mirroring circuits 102 to each I/O transmitter 104 along the edge of the die 110. Due to large current distribution networks to distribute the bias currents from the centralized ICOMP, local layout techniques to reduce the impact of within-die variations such as nesting, inter-digitation, and matching cannot be used to ensure that the entire distribution network of current mirrors generate the same bias current for every I/O transmitter—to apply the local layout techniques all current mirrors must be inter-digitated with each other which cannot be done practically when the current mirrors are not close to one another or when the current mirrors do not abut one another.

Consequently, the bias current generated by the ICOMP and transmitted to each I/O transmitter via the distribution network has different current values from one end of the edge of the die to the other end of the edge of the same die. These different values of the bias current caused by the within-die variations of the distributed network, including current mirror circuits 102 and bias generators 103, result in I/O lane to lane variations in output signal swings.

FIG. 1B is a transistor level traditional ICOMP scheme 120 to show a number of transistors that contribute to the within-die variations in the output signal swing of each transmitter of a plurality of transmitters. The ICOMP scheme 120 includes the ICOMP generator 101 to generate a compensated bias current which is distributed by current mirrors (e.g., 102) to each I/O transmitter (e.g., 103) having a local bias generator with transistors M5-M7 and the transmitter driver 104. In this traditional ICOMP scheme 120, at least 10 transistors, M1-M10, contribute to variations in the output signal swings between the transmitters. These within-die variations can be very large e.g., +/−80% variations in output signal swings between the I/O transmitter lanes. As mentioned above, transistors M9 and M10 cannot take advantage of local layout techniques to reduce spatial mismatches because they are not next to each other i.e., they are not abutting each other. In some instances where transistors M1-M8 are very close to one another, they can use layout techniques such as nesting to eliminate spatial effects but random mismatches are still present in each of the transistors and such random mismatches are additive with respect to within-die variations. Consequently, transistors M1-M10 may aggregate the effect of within-die variations on the output signal swing of the I/O transmitters.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention relate to a method and apparatus for minimizing within-die variations in performance parameters of a processor. For illustrating the invention, the embodiments of the invention discuss the impact of within-die variations on the output signal swings of I/O transmitters of an I/O system in a processor. The embodiments of the invention are applicable to reduce the effect of within-die variations in other performance parameters such as jitter, slew rate, power supply rejection, etc. Therefore, the embodiments of the invention are not limited to reducing within-die variations in output signal swings of I/O transmitters of an I/O system.

Figure 1A:
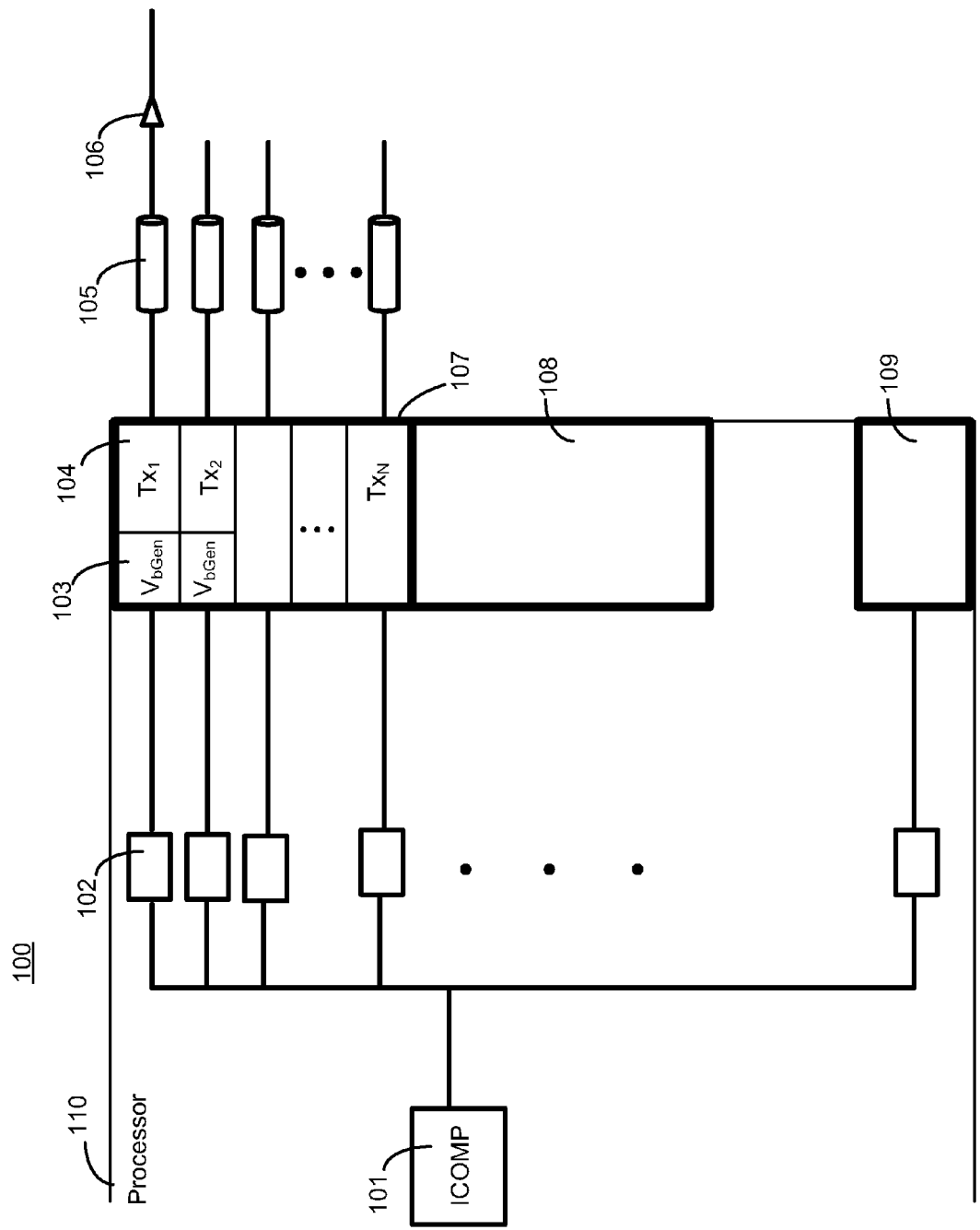
FIG. 1A illustrates a traditional centralized current reference generator (ICOMP) to provide bias current to each set of I/O transmitters from a plurality of sets of I/O transmitters.
Figure 1B:
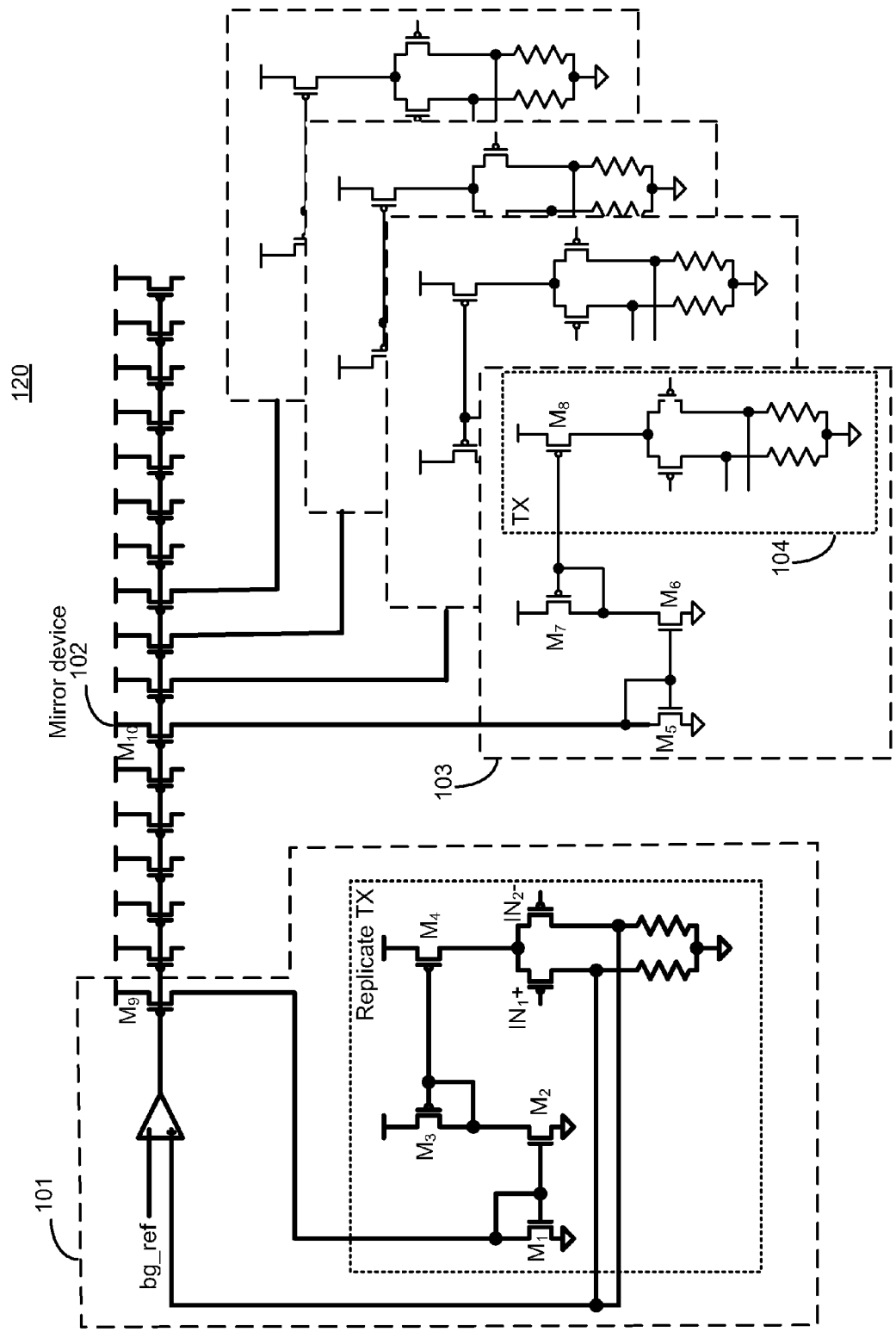
FIG. 1B illustrates a circuit level traditional centralized current reference generator (ICOMP) with distributed current mirrors to provide bias current to each set of I/O transmitters from a plurality of sets of I/O transmitters.

In one embodiment, the ICOMP schemes of FIGS. 1A-B are replaced with another centralized reference generator which eliminates the distribution network of current mirrors of FIGS. 1A-B. In such an embodiment, the effect of within-die variations is reduced by at least 80% over the ICOMP scheme of FIGS. 1A-B because at least 80% of the transistors that contributed to the within-die variation effects in the traditional ICOMP scheme are eliminated. Consequently, I/O lane to lane within-die variations in the output signal swings are reduced. By minimizing lane to lane within-die variations in the output signal swings, timing budget of the I/O system is improved thus allowing the I/O transmitters of each lane to operate faster than before. In one embodiment of the present invention, the transmitters can operate 20% faster by minimizing lane to lane within-die variations in the output signal swings.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction any may be implemented with any suitable type of signal scheme, e.g., differential pair, single-ended, etc.

Figure 2:
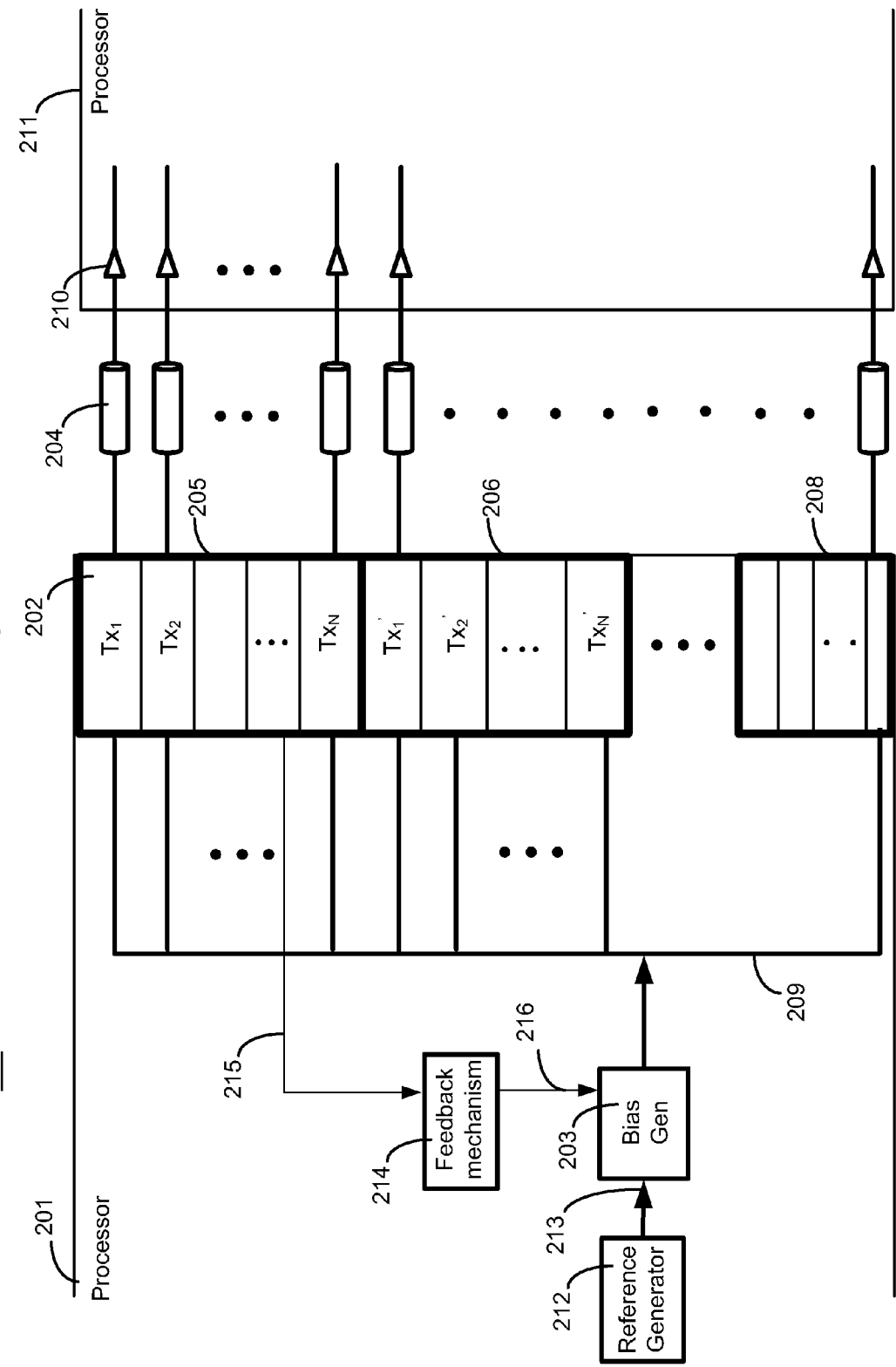
FIG. 2 is a high level apparatus to reduce I/O lane to lane transmitter output signal swing variations for a plurality of sets of I/O transmitters, according to one embodiment of the invention.

FIG. 2 is a high level apparatus 200 to reduce I/O lane to lane transmitter output signal swing within-die variations for a plurality of sets of I/O transmitters, according to one embodiment of the invention. In one embodiment, the high level apparatus 200 includes a first processor 201 coupled with a second processor 211 via an interconnect 204. In such an embodiment, the first processor 201 is operable to transmit data via the I/O transmitter 202 over the interconnect 204 to a receiver 210 of the second processor 211. In one embodiment, the interconnect 204 is a point-to-point interconnect. In other embodiment, the interconnect 204 is a multi-user interconnect.

In one embodiment, the first processor 201 comprises a centralized reference generator 212 to generate a reference signal 209 for the I/O transmitters. In one embodiment, the reference generator 212 is a voltage reference generator to generate an adjustable reference voltage 213 which is compensated for process, temperature, and/or voltage variations. In one embodiment, the processor 201 further comprises a bias generator 203 coupled with the reference generator 212. In one embodiment, the bias signal 209 generated by the bias generator 203 is distributed directly to each transmitter (e.g., 202) of a set of transmitters (e.g., 205) from a plurality of sets of transmitters (e.g., 205, 206, and 208). In one embodiment, the bias signal 209 generated by the bias generator 203 is distributed to each set of transmitters from the plurality of sets of transmitters instead of directly distributing to individual transmitters of each set.

With reference to the ICOMP scheme of FIGS. 1A-B, the system of FIG. 2 is operable to generate a bias signal 209 which is directly distributed to each set of transmitters or to individual transmitters without having current mirrors or voltage followers to contribute to the within-die variations of the output signal swing of the transmitters.

Referring back to FIG. 2, in one embodiment, the processor 201 further comprises a feedback mechanism 214 which is discussed in more detail with reference to FIG. 3 and FIG. 4. In one embodiment, the feedback mechanism 214 is operable to sample an output signal 215 from the corresponding set of output signals from each set of transmitters (205, 206, and 208) to generate a sampled output signal 216. In one embodiment, the sampled output signal 216 is used by the bias generator 203 to generate the bias signal 209.

Figure 3:
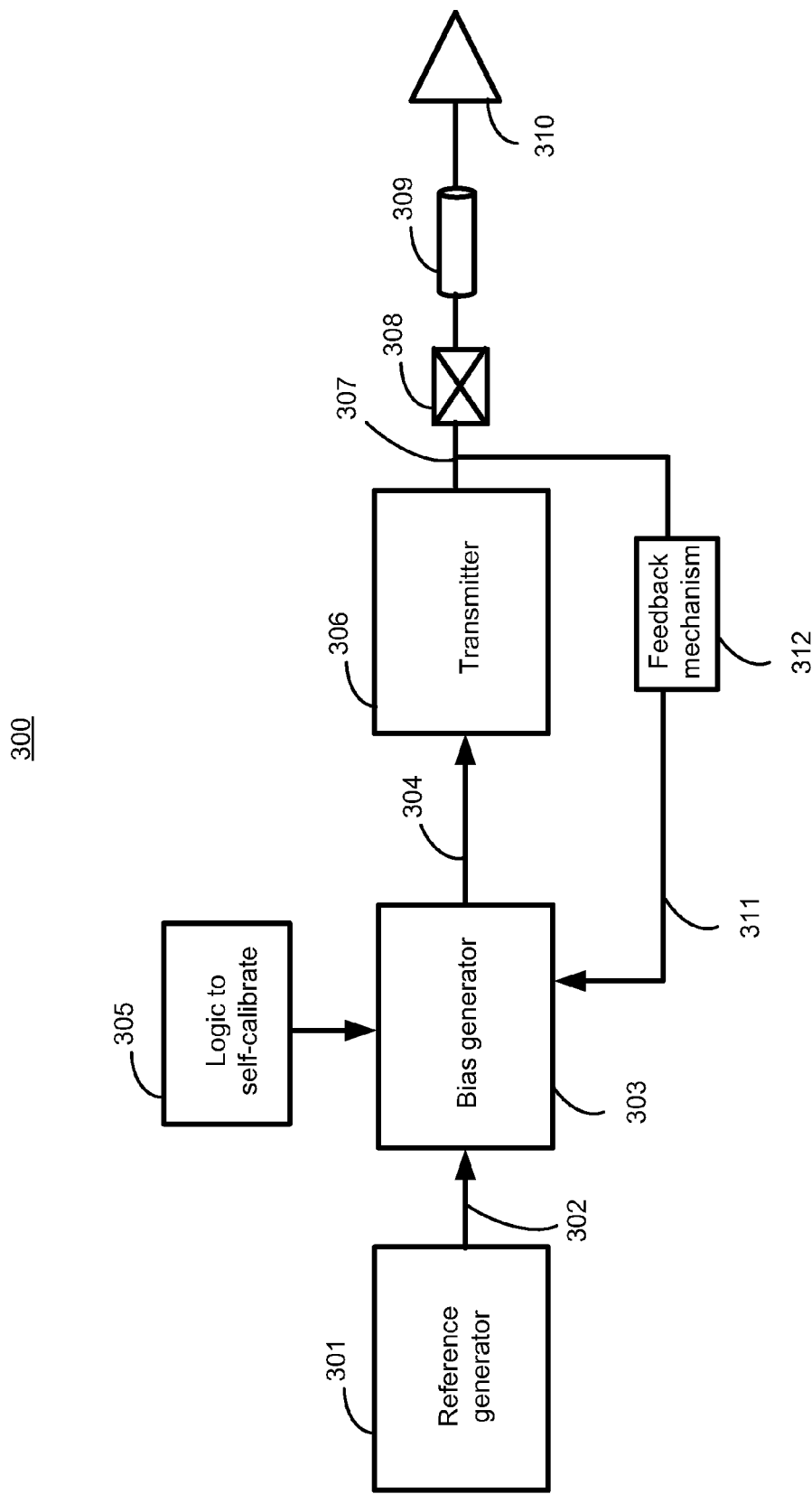
FIG. 3 is a detailed description of the high level apparatus to reduce I/O lane to lane transmitter output signal swing variations, according to one embodiment of the invention.

FIG. 3 is a detailed description of the high level apparatus to reduce I/O lane to lane transmitter output signal swing within-die variations, according to one embodiment of the invention. The apparatus 300 of FIG. 3, in one embodiment, comprises a reference generator 301 to generate a reference signal 302 for a bias generator 303. In one embodiment, the reference signal 302 is a reference voltage signal which is compensated for process, temperature, and/or voltage. In one embodiment, the bias generator 303 generates a bias signal 304 via the feedback signal 311 and the reference signal 302. In one embodiment, the reference generator 301 includes a band-gap circuit (not shown) with an adjustable output. In one embodiment, the bias generator 303 is a folded cascode operational amplifier (OPAMP) operable to receive the reference signal 302 and the feedback signal 311 to generate the bias signal 304.

In one embodiment, the bias signal 304 controls the current source of the transmitter 306 so that the transmitter 306 operates with a stable current which is the same current as in other transmitters (not shown) of the die. In one embodiment, the bias signal 304 is a voltage signal. In another embodiment, the bias signal 304 is a current signal.

In one embodiment, the transmitter 306 transmits an output signal 307 to a receiver 310 via a pad 308 and an interconnect 309. In one embodiment, the output signal 307 is a differential signal having complementary signals. In one embodiment, a feedback mechanism 312 is implemented to sample the output signal 307 from the transmitter 306 and to provide a feedback signal 311 to the bias generator 303 to generate a stable bias signal 304. In one embodiment, the feedback mechanism 312 is operable to generate a common mode signal 311 from the output differential signal 307. A common mode signal is an instantaneous average signal of the output differential signal 307.

In one embodiment, the feedback mechanism 312 includes a peak detection logic (not shown) to detect the output signal as it rises to its maximum signal level. In one embodiment, the peak detection logic is enabled when the transmitter 306 is a push-pull based transmitter. In such an embodiment, the feedback mechanism 312 generates the sampled output signal 311 (also called feedback signal) which is proportional to an amplitude of the output signal. In one embodiment, proportional to the amplitude of the output signal means that the sampled output signal 311 is equal to the amplitude of the output signal. In other embodiments, proportional to the amplitude of the output signal means being half of the amplitude of the output signal. In yet other embodiments, proportional means a fraction of the amplitude of the output signal which is half or more than half of the amplitude of the output signal. In one embodiment, the peak detection logic is enabled when the common-mode of the output signal 307 is not proportional to the output signal swing and so the common-mode of the output signal 307 cannot be used as the feedback signal 311.

In one embodiment, the feedback mechanism 312 is operable to receive a plurality of sampled output signals (not shown) from each feedback mechanism associated with each transmitter of the set of transmitters and to generate the sampled output signal 311 (also known as the feedback signal) based on an average of the plurality of sampled output signals. In such an embodiment, random mismatch in the level of the bias signal 304 caused by within-die variations in the bias generator 303 is reduced. One reason for such reduction in the random mismatch effect in the bias generator 303 is that the effects of random mismatch of each bias generator 303 associated with each transmitter 306 or with a set of transmitters 205 of FIG. 2 is averaged by generating a feedback signal 311 based on the average of the feedback signals associated with each transmitter of the set of transmitters.

In one embodiment, a logic unit 305 coupled with the bias generator 303 is used to self-calibrate the bias generator 303. Self-calibration is a process by which the devices of the bias generator 303 are adjusted by means of adjusting the strength of the devices so that bias generator 303 has a zero input offset. In one embodiment, the logic unit 305 executes the self-calibration process at power-up timeframe and/or during training phase of the I/O system of the processor. In one embodiment, the logic unit 305 is a finite state machine (FSM) having an up-down counter (not shown) to enable or disable devices operable to receive the reference signal 302 and the feedback signal 311.

In one embodiment, the process of self-calibration is implemented by computer executable instructions stored on a computer/machine readable medium. As discussed below, the apparatus 300 reduces the I/O lane to lane within-die variations in I/O performance parameters such as output signal swing because the number of devices that contribute to within-die variations in the I/O performance parameters is reduced. In one embodiment, the number of devices that contribute to within-die variations in the I/O performance parameters is reduced by at least 80% compared to the ICOMP scheme of FIGS. 1A-B. As shown in FIG. 3, the reference signal 302 is directly input to the bias generator 303 without any current mirrors or voltage followers. Such direct input reduces the I/O lane to lane within-die variations in the I/O performance parameters because there are fewer distributed devices in the die to distribute the reference signal 302 to the bias generators (e.g., 303).

Figure 4:
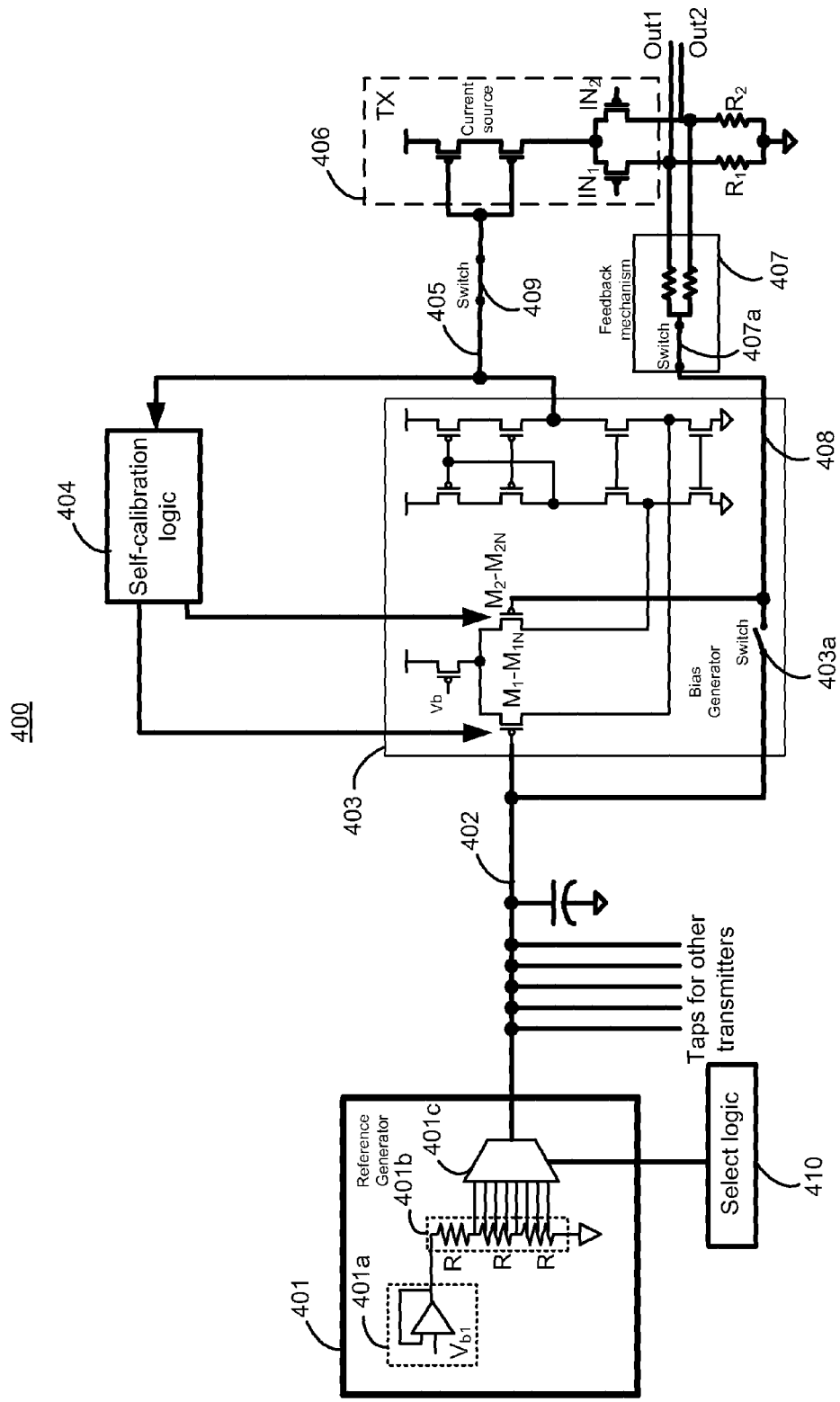
FIG. 4 is a circuit level implementation to reduce I/O lane to lane transmitter output signal swing variations, according to one embodiment of the invention.

FIG. 4 is a circuit level apparatus 400 to reduce I/O lane to lane output signal swing variations, according to one embodiment of the invention. In one embodiment, the apparatus 400 comprises an adjustable reference generator 401 to generate a reference voltage signal 402 which is compensated for process, temperature, and voltage variations. In one embodiment, the adjustable reference generator 401 includes a band-gap circuit 401a coupled with an adjustment circuit 401b and a selector unit 401c.

In one embodiment, the band-gap circuit 401a generates a compensated reference signal which is used by the adjustment circuit 401b to generate subsets of the compensated reference signal. In one embodiment, the adjustment circuit 401b is a voltage divider circuit with resistors to divide the compensated reference signal into subsets of compensated reference signals. In one embodiment, these subsets of compensated reference signals are input to the selector unit 401c which is operable to output a reference signal 402 for a bias generator 403 from among the subsets of compensated reference signals. In one embodiment, the reference signal 402 determines the output signal swing generated by the transmitter 406.

Depending on the electrical specifications of an I/O system, the output signal swing can be adjusted (made higher or lower) based on the selected level of the reference signal 402. In one embodiment, the reference signal 402 is used to generate a bias signal 405 that controls the current of the transmitter 406 and thus adjusts the output signal swing generated by the transmitter 406.

In one embodiment, the reference signal 402 from the reference generator 401 is set to 250 mV to generate an output signal swing ranging from 0 V to 500 mV.

In one embodiment, the selector unit 401c of the reference generator 401 also receives the compensated reference signal from 401a along with the subsets of the compensated reference signals from 401b. In one embodiment, the selector unit 401c is a multiplexer controlled by a select logic 410. The select logic 410, in one embodiment, is hardware logic. In other embodiments the select logic 410 is implemented as software. In such an embodiment, the select logic 410 comprises computer executable instructions stored on a computer readable medium that when executed cause the selector unit 401c to select a reference signal. In one embodiment, the select logic 408 is implemented in both hardware and software.

In one embodiment, the output signal 402 of the reference generator 401 is distributed without current mirrors to the bias generator 403. In one embodiment, the bias generator 403 is an operational amplifier (OPAMP) operable to receive the reference signal 402 and a feedback signal 408 to generate a bias signal 405. In one embodiment, the bias generator is a folded cascode operational amplifier operable to receive the reference signal 402 and a feedback signal 408 to generate a bias signal 405. In one embodiment, the input transistors of the folded cascode operational amplifier M1-M1N and M2-M2N are selectable transistors.

In one embodiment, a logic unit 404 selects the selectable transistors M1-M1N and M2-M2N so that the bias generator 403 is self-calibrated at power-up and/or a training phase. In one embodiment, the logic unit 404 receives the output signal 405 of the bias generator 403 and selects the number of selectable transistors/devices M1-M1N and M2-M2N by turning them on or off so that the bias generator 403 is self-calibrated. In one embodiment, the self-calibration process discussed above cancels any input amplifier offset of the bias generator 403. As mentioned with reference to FIG. 3, the logic unit 305 (which is the same as the logic unit 404 of FIG. 4) is implemented as hardware or software.

In one embodiment, during the self-calibration process, the logic unit 404 inputs the reference signal 402 to both input devices (M1-M1N and M2-M2N) of the bias generator 403 via a switch 403a. In one embodiment, the switch 403a is turned on during the self-calibration process and turned off when the self-calibration process is over. In such an embodiment, the feedback signal 408 is not used by the bias generator 403 because the switch 403a is turned on and a switch 407a is turned off during the self-calibration. In one embodiment, the output signal 405 of the bias generator 403 is used by the logic unit 404 to enable or disable the selectable devices M1-M1N and M2-M2N until the input offset of the bias generator 403 is cancelled. At that point, the bias generator 403 is self-calibrated. During the self-calibration process, the bias signal 405 from the bias generator 403 is not used by the transmitter 406. In one embodiment, a switch 409 is turned off to stop the transmitter 406 from receiving the bias signal 405 during self-calibration process.

In one embodiment, the switches 403a, 407a, and 409 are pass-gate transistors. In other embodiments, other switches may be used to switch on or off during the self-calibration process. In one embodiment the switches are controlled by the logic unit 404. In other embodiments, other logic units including hardware and/or software may control the turning on and off time of the switches 403a, 407a, and 409.

Once the bias generator 403 is self-calibrated, the feedback signal 408 is input to the bias generator 403 so that the bias generator 403 is operable to receive the reference signal 402 and the feedback signal 408, according to one embodiment. At that point, the transmitter 406 is enabled to receive the bias signal 405 via the now turned on switch 409, according to one embodiment.

In one embodiment, the transmitter 406 is operable to generate an output signal from an input signal. In one embodiment, the output signal is a differential signal with complementary signals Out1 and Out2 generated from input signals In1 and In2, respectively. In other embodiments, the output signal is a single-ended signal. In one embodiment, the transmitter 406 receives the bias signal 405 which determines the amount of current provided by the transmitter current source to generate the output signal. The level of the bias signal 405 also determines the output signal swing of Out1 and Out2. For the embodiment shown in FIG. 4, if the bias signal 405 is closer to a Vss (ground) level, the output signal swing is higher than when the bias signal 405 is closer to a Vcc (supply) level.

In one embodiment, the output signals Out1 and Out2 are input to a feedback mechanism 407. The feedback mechanism 407, in one embodiment, is operable to generate a common mode of the output signals Out1 and Out2. In one embodiment, the feedback mechanism 407 comprises a pair of resistors coupled with the output signals Out1 and Out2 on one end of the resistors and on the other end of the resistors an output node is merged to generate the common mode of the output signals Out1 and Out2. In one embodiment, the resistors are 1 KOhm resistors. In another embodiment, the feedback mechanism includes a peak detection logic as discussed with reference to FIG. 3. Referring back to FIG. 4, in one embodiment the feedback mechanism 307 is a sample and hold circuit. In one embodiment, the feedback signal 408 is input to the bias generator 403 along with the reference signal 402 to generate the bias signal 405.

In one embodiment, the apparatus of FIG. 4 is operable to generate the bias signal 405 by eliminating most of the devices from FIGS. 1A-B that contributed to the within-die variation of the performance parameters such as the output voltage swing of the transmitter 406. In one embodiment, the apparatus 400 is operable to use local layout techniques on the devices M1-M1N and M2-M2N because the devices are local to the bias generator 403 and that these devices are not distributed over the die. The local layout techniques (such as nesting and inter-digitation) remove the systematic within-die variations within the devices M1-M1N and M2-M2N. As a result of minimizing the number of devices that cause the within-die variations to the input devices M1-M1N and M2-M2N of the bias generator 403, the bias signal 405 for the transmitter 406 remains stable across the die and random variations from those devices also reduce because there are fewer devices to contribute to random variations. Consequently, the performance parameters of a transmitter, such as the output signal swing of the transmitter, remains the same as the output signal swing of other transmitters across the die that receive the same bias signal 402.

In one embodiment, a single bias generator is used to generate a bias signal 405 for a set of transmitters from a plurality of sets of transmitters. In such an embodiment, the overall power consumption of the processor is reduced because every transmitter does not have a corresponding bias generator 403. In other embodiments, each transmitter is coupled with its individual bias generator 403.

Figure 5:
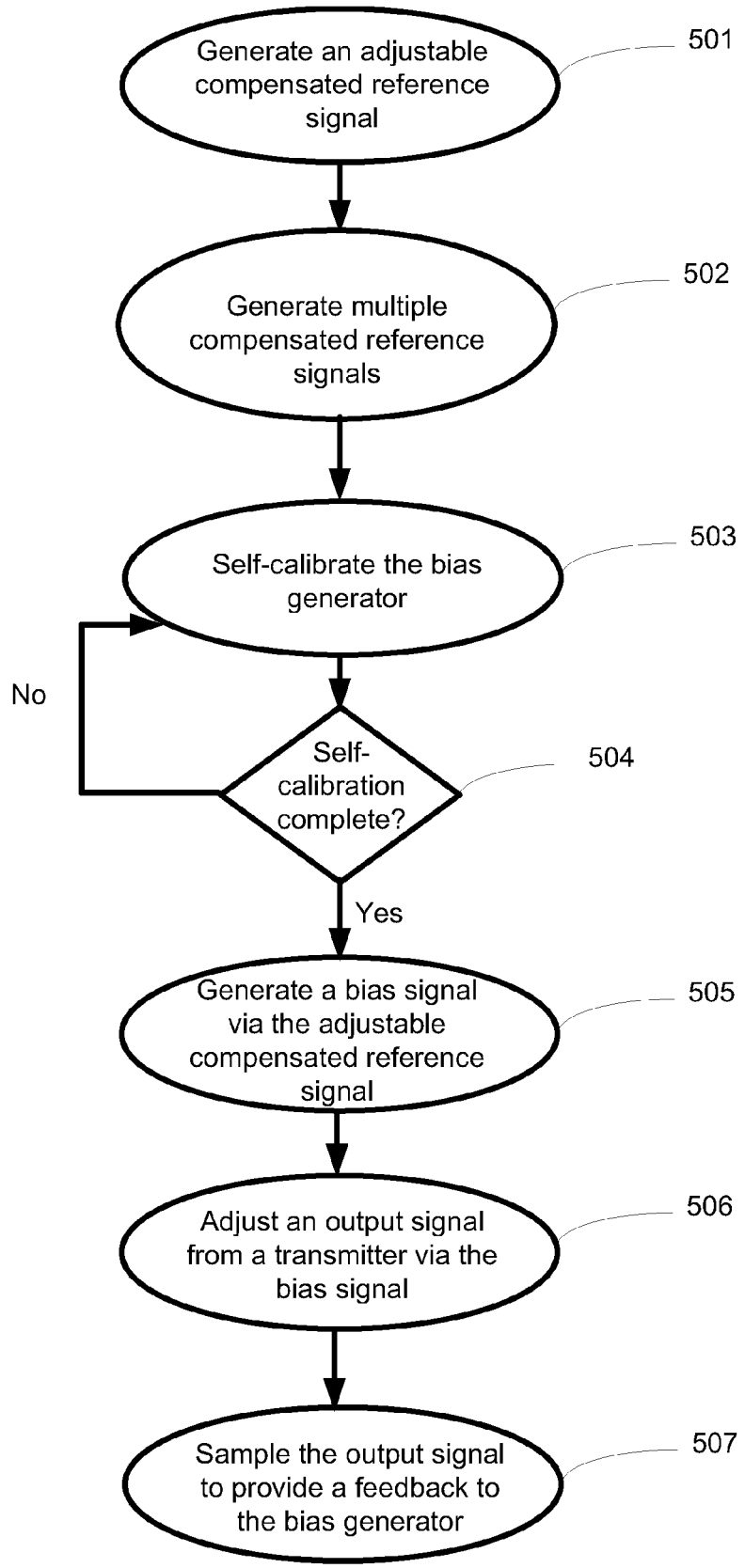
FIG. 5 is a flowchart of a method for minimizing within-die variations, according to one embodiment of the invention.

FIG. 5 is a flowchart 500 of a method for minimizing I/O lane to lane transmitter output signal swing variations, according to one embodiment of the invention. The method is discussed with reference to embodiments discussed in FIGS. 2-4. At block 501, an adjustable compensated reference 302 signal is generated by the reference generator 301. This reference signal 302 is input to the bias generator 303. At block 502, multiple compensated reference signals 402 are tapped from the adjustable compensated reference signal 301. These multiple compensated reference signals 402 are distributed over the die to the bias generators of the transmitters. In one embodiment, the multiple compensated reference signals 402 are distributed to each set of a plurality of sets of transmitters, wherein each set has one or more bias generators for the set of transmitters. In other embodiments, the multiple compensated reference signals 402 are distributed to each transmitter (having a corresponding bias generator) of the sets of transmitters.

At block 503, the bias generator 303 is self-calibrated so that its input offset is cancelled. In one embodiment, block 503 is performed at power-up timeframe and/or during a training phase of the I/O system. At block 504, a determination is made whether the self-calibration process is complete. If the self-calibration process is incomplete, the process of block 503 continues. Once the self-calibration process is complete i.e., the power-up timeframe ends and/or the training phase of the I/O system completes, at block 505 a bias signal 304 is generated by the bias generator 303 via the adjustable compensated reference signal 302.

At block 506, the bias signal 304 determines the output signal swing and other performance parameters of the transmitter 306. As discussed above, the output signal swing is adjustable based on the level of the bias signal 304.

At block 507, the output signal is sampled by the feedback mechanism 312 and input to the bias generator 303. As mentioned above, in one embodiment, the feedback mechanism 312 is operable to receive a plurality of sampled output signals (not shown) from each feedback mechanism associated with each transmitter of the set of transmitters and to generate the sampled output signal 311 (also known as the feedback signal) based on an average of the plurality of sampled output signals.

Elements of embodiments are also provided as a machine-readable storage medium for storing the computer-executable instructions. For example, the select logic 410 and the logic unit 404 of FIG. 4 are programmable via computer-executable instructions. The machine-readable storage medium may include, but is not limited to, flash memory, optical disks, CD-ROMs, DVD ROMs, RAMs, EPROMs, EEPROMs, magnetic or optical cards, or other type of machine-readable storage media suitable for storing electronic or computer-executable instructions. For example, embodiments of the invention may be downloaded as a computer program which may be transferred from a remote computer (e.g., a server) to a requesting computer (e.g., a client) by way of data signals via a communication link (e.g., a modem or network connection).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, the bias generator 403 and the transmitter 406 of FIG. 4 that are shown as having PMOS based input devices can be implemented as NMOS based devices without changing the principal of the embodiments. Likewise, the folded cascode amplifier 403 of FIG. 4 can be replaced with other amplifiers operable to receive voltage signals as inputs. The resister divider 401b of FIG. 4 can be replaced with any other voltage dividing circuit that generates multiple voltages based on the compensated reference signal from the reference generator 401a. While the reference generator is shown as a band-gap circuit 401a in FIG. 4, other reference generators that generate a stable reference signal which is compensated for process, temperature, and/or voltage can also be used without changing the principal of the embodiments. The transmitter 406 of FIG. 4 which is shown as a differential PMOS input based amplifier with controllable PMOS based current source can be replaced with an NMOS input based amplifier with an NMOS based current source operable to receive the bias signal 405. In such an embodiment, the bias signal 405 is operable by the bias generator 403 to be of a bias level which controls the NMOS based current source in the transmitter instead of PMOS based current source in the transmitter. In one embodiment, the transmitter 406 is a push-pull based transmitter operable to receive a bias signal to adjust its drive strength to control performance parameters such as output signal swing of the push-pull transmitter.

The embodiments of the invention are intended to embrace all such alternatives, modifications, and variations as to fall within the broad scope of the appended claims.

We claim:

1. An apparatus comprising:
   a reference generator to generate an adjustable compensated reference signal;
   a differential amplifier having a first p-type device to receive the adjustable compensated reference signal, and a second p-type device to receive a common mode of at least two signals; and
   a logic to adjust size of the first and/or second p-type devices according to an output of the differential amplifier.

2. The apparatus of claim 1 comprises a first switch coupled to the output of the differential amplifier.

3. The apparatus of claim 2 comprises a current source coupled to the first switch.

4. The apparatus of claim 3 comprises a current mode driver coupled to the current source.

5. The apparatus of claim 4, wherein the current mode driver comprises:
   a pair of p-type devices to receive input signals; and
   a first pair of resistive devices coupled to the pair of p-type devices of the current mode driver.

6. The apparatus of claim 5 comprises a second pair of resistive devices coupled to the first pair of resistive devices and the pair of p-type devices of the current mode driver.

7. The apparatus of claim 6 comprises a second switch coupled to the second pair of resistive devices and the second p-type device of the differential amplifier.

8. The apparatus of claim 7 comprises a third switch coupled to the first and second p-type devices of the differential amplifier.

9. The apparatus of claim 1, wherein the differential amplifier is a folded cascode amplifier.

10. An apparatus comprising:
    a plurality of transmitters, wherein each transmitter comprises a current source; and a current mode driver coupled to the current source;
    a reference generator to generate an adjustable compensated reference signal;
    a differential amplifier having a first p-type device to receive the adjustable compensated reference signal, and a second p-type device to receive a common mode of at least two signals, wherein the differential amplifier is coupled to at least one of the plurality of transmitters via a feedback mechanism; and
    a logic to adjust size of the first and/or second p-type devices according to an output of the differential amplifier.

11. The apparatus of claim 10, wherein the current mode driver comprises:

a pair of p-type devices to receive input signals; and a first pair of resistive devices coupled to the pair of p-type devices.

12. The apparatus of claim 11 comprises a first switch coupled to the output of the differential amplifier and the current source.

13. The apparatus of claim 12 comprises a second pair of resistive devices coupled to the first pair of resistive devices and the pair of p-type devices.

14. The apparatus of claim 13 comprises:

a second switch coupled to the second pair of resistive devices and the second p-type device of the differential amplifier; and a third switch coupled to the first and second p-type devices of the differential amplifier.

15. An apparatus comprising:

a reference generator to select a reference voltage from among a plurality of reference voltages;

a differential amplifier having a first p-type device to receive the selected reference signal, and a second p-type device to receive a common mode of at least two signals;

a current source; and a first switch coupled to the output of the differential amplifier and the current source.

16. The apparatus of claim 15 comprising a logic to adjust size of the first and/or second p-type devices according to an output of the differential amplifier.

17. The apparatus of claim 15 comprises a current mode driver coupled to the current source, wherein the current mode driver comprises:

a pair of p-type devices to receive input signals; and a first pair of resistive devices coupled to the pair of p-type devices.

18. The apparatus of claim 17 comprises a second pair of resistive devices coupled to the first pair of resistive devices and the pair of p-type devices.

19. The apparatus of claim 18 comprises a second switch coupled to the second pair of resistive devices and the second p-type device of the differential amplifier.

20. The apparatus of claim 19 comprises a third switch coupled to the first and second p-type devices of the differential amplifier.

* * * * *